United States Patent
Xiang

(10) Patent No.: US 9,496,523 B1
(45) Date of Patent: Nov. 15, 2016

(54) DEVICES AND METHODS TO IMPROVE LIGHT OUTCOUPLING FROM AN OLED ARRAY

(71) Applicant: Universal Display Corporation, Ewing, NJ (US)

(72) Inventor: Chaoyu Xiang, Monmouth Junction, NJ (US)

(73) Assignee: Universal Display Corporation, Ewing, NJ (US)

( * ) Notice: Subject to any disclaimer, the term of this patent is extended or adjusted under 35 U.S.C. 154(b) by 13 days.

(21) Appl. No.: 14/744,871

(22) Filed: Jun. 19, 2015

(51) Int. Cl.
*H01L 51/52* (2006.01)
*H01L 51/56* (2006.01)

(52) U.S. Cl.
CPC .......... *H01L 51/5275* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,072,620 A | 6/2000 | Shiono et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,829,087 B2 | 12/2004 | Freese et al. | |
| 7,012,363 B2 | 3/2006 | Weaver et al. | |
| 7,279,704 B2 | 10/2007 | Walters et al. | |
| 7,431,968 B1 | 10/2008 | Shtein et al. | |
| 7,968,146 B2 | 6/2011 | Wagner et al. | |
| 8,179,034 B2 * | 5/2012 | Potts | B82Y 20/00 313/504 |
| 8,257,793 B2 | 9/2012 | Forrest | |
| 8,446,093 B2 * | 5/2013 | Kim | H01L 51/5253 313/504 |
| 8,896,925 B2 | 11/2014 | Han et al. | |

(Continued)

FOREIGN PATENT DOCUMENTS

| | | |
|---|---|---|
| WO | 2006129265 A2 | 12/2006 |
| WO | 2008057394 | 5/2008 |
| WO | 2010011390 | 1/2010 |

OTHER PUBLICATIONS

Baldo, et al., "Highly efficient phosphorescent emission from organic electroluminescent devices", Nature, vol. 395, pp. 151-154, 1998.

(Continued)

*Primary Examiner* — Lex Malsawma
(74) *Attorney, Agent, or Firm* — Morris & Kamlay LLP

(57) ABSTRACT

A device, includes a substrate, an organic light emitting diode (OLED) disposed over the substrate, a first layer optically coupled to the OLED and having a first surface including a first plurality of topographical surface features and an index of refraction n1, and an enhancement layer optically coupled to the OLED and vertically stacked with the first layer, having a thickness of not more than 100 nm, a second surface including a second plurality of topographical surface features, and an index of refraction n2, wherein n2 has at least a 0.1 difference from an index of refraction of at a top layer and a bottom layer adjacent to the enhancement layer.

20 Claims, 10 Drawing Sheets

(56) References Cited

U.S. PATENT DOCUMENTS

| | | | |
|---|---|---|---|
| 2003/0230980 A1 | 12/2003 | Forrest et al. | |
| 2004/0140758 A1 | 7/2004 | Raychaudhuri et al. | |
| 2004/0174116 A1 | 9/2004 | Lu et al. | |
| 2006/0060888 A1* | 3/2006 | Kim | H01L 21/02378 257/200 |
| 2007/0132378 A1* | 6/2007 | Cok | H01L 51/5268 313/506 |
| 2008/0277680 A1* | 11/2008 | Bertram | B82Y 20/00 257/98 |
| 2008/0283821 A1* | 11/2008 | Park | H01L 21/02381 257/13 |
| 2008/0285304 A1* | 11/2008 | Rankin, Jr. | G02B 6/0036 362/602 |
| 2010/0033829 A1 | 2/2010 | Wippermann et al. | |
| 2010/0181899 A1 | 7/2010 | Forrest et al. | |
| 2010/0258821 A1* | 10/2010 | Forrest | H01L 51/5271 257/88 |
| 2011/0116014 A1 | 5/2011 | Lee et al. | |
| 2011/0259407 A1 | 10/2011 | Kim et al. | |

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.

Becker, et al., "Fabrication of microstructures with high aspect ratios and great structural heights by synchrotron radiation lithography, galvanoforming, and plastic moulding (LIGA process)", Microelectronic Engineering 4 (1986) 35-56 North Holland.

Becker, et al., "Hot embossing as a method for the fabrication of polymer high aspect ratio structures", Sensors and Actuators 83 (2000), pp. 130-135.

Dodabalapur, et al., "Physics and applications of organic microcavity light emitting diodes", Journal of Applied Physics; 80, 6954 (1996).

Kuo, et al., "Fabrication of aspherical SU-8 microlens array utilizing novel stamping process and electrostatic pulling method", 2010 Optical Society of America—vol. 18, No. 18 / Optics Express, Aug. 25, 2010, 19114-19119.

Liu, et al., "Fabrication of an aspherical microlens for OLED with modified etching process", 2010 International Conference on Electrical and Control Engineering, 4839-4841.

Meerheim, et al., "Quantification of energy loss mechanisms in organic light-emitting diodes", Applied Physics Letters 97, 253305 (2010).

Moeller, et al., "Improved light emitting diodes employing ordered microlens arrays", Journal of Applied Physics 91, 3324 (2002); doi: 1063/1.1435422.

Morford, et al., "Press-patterned UV-curable high refractive index coatings", Proceedings of SPIE, vol. 6123, Society of Photo-Optical Instrumentation Engineers, 2006, pp. 612301-1-612301-11.

Woo, et al., "Light extraction from organic light-emitting diodes enhanced by spontaneously formed buckles", Nature Photonics; Letters; c. 2010; vol. 4; pp. 222-226.

* cited by examiner

DEVICES AND METHODS TO IMPROVE LIGHT OUTCOUPLING FROM AN OLED ARRAY

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to techniques and structures for improving outcoupling efficiency and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

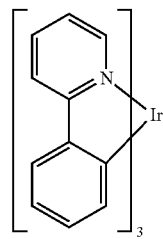

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment, a device includes a substrate, an organic light emitting diode (OLED) disposed over the substrate, a first layer optically coupled to the OLED and having a first surface including a first plurality of topographical surface features and an index of refraction n1, and an enhancement layer optically coupled to the OLED and vertically stacked with the first layer, having a thickness of not more than 100 nm, a second surface including a second plurality of topographical surface features, and an index of refraction n2, wherein n2 has at least a 0.1 difference from an index of refraction of a top layer and a bottom layer adjacent to the enhancement layer.

The second plurality of topographical features may be aligned with the first plurality of topographical surface features.

The second plurality of topographical features may have a contour that is the same as a contour of the first plurality of topographical features, but are not aligned with the first plurality of topographical surface features.

The first plurality of topographical surface features may be different from the second plurality of topographical surface features.

The second plurality of topographical surface features may be smaller than the first plurality of topographical surface features.

Each of the first and second plurality of topographical surface features may be independently selected from a group consisting of: microlenses, a corrugated pattern, pyramidal features, spherical features, aspherical features, non-sharp-edged shapes and a wrinkled structure.

The first and second plurality of topographical surface features may include structures that have different sizes.

The enhancement layer may be a material having a refractive index in the range of 1.0 to 3.0.

The enhancement layer may be a material selected from the group consisting of: a polymeric material, an inorganic material, an organic material, or a metal.

The OLED may be a top emitting OLED.

The OLED may be a bottom emitting OLED.

The second surface may not be in direct physical contact with the first surface.

The enhancement layer may be disposed within the first layer.

The first layer may be in direct physical contact with the enhancement layer.

The first layer may be disposed adjacent to the substrate.

The first layer may be disposed adjacent to the OLED.

The first layer may be disposed within the OLED.

The device may include a functional layer optically coupled to the OLED and disposed between the OLED and the substrate.

The functional layer may be one selected from the group consisting of: a barrier layer, a planarazing layer and a stress matching layer.

The functional layer may be the first layer.

The first layer and the enhancement layer may be disposed at an interface between the OLED and the functional layer.

The first layer and the enhancement layer may be disposed at an interface between the substrate and the functional layer.

The device may further include a second layer optically coupled to the OLED and having a third surface including a third plurality of topographical surface features and an index of refraction n3, and a second enhancement layer optically coupled to the OLED and vertically stacked with the second layer, having a thickness of not more than 100 nm, a fourth surface including a fourth plurality of topographical surface features, and an index of refraction n4, wherein n3 has at least a 0.1 difference from an index of refraction of a top layer and a bottom layer adjacent to the second enhancement layer.

The first and second layers and the first and second enhancement layers may be positioned to provide a maximum index difference at a first interface between the functional layer and the substrate and a second interface between the functional layer and the OLED.

The first layer and the enhancement layer may be disposed at a first interface between the substrate and the functional layer, and the second layer and the second enhancement layer are disposed at a second interface between the OLED and the functional layer.

A reflecting electrode may be optically coupled to the OLED.

The first layer and the enhancement layer may be disposed above the reflecting electrode.

According to another embodiment, a first device comprising a first organic light emitting device is also provided. The first organic light emitting device can include an anode, a cathode, and an organic layer, disposed between the anode and the cathode. The organic layer can include a substrate, an organic light emitting diode (OLED) disposed over the substrate, a first layer optically coupled to the OLED and having a first surface including a first plurality of topographical surface features and an index of refraction n1, and an enhancement layer optically coupled to the OLED and vertically stacked with the first layer, having a thickness of not more than 100 nm, a second surface including a second plurality of topographical surface features, and an index of refraction n2, wherein n2 has at least a 0.1 difference from an index of refraction of a top layer and a bottom layer adjacent to the enhancement layer. The first device can be a consumer product, an organic light-emitting device, and/or a lighting panel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
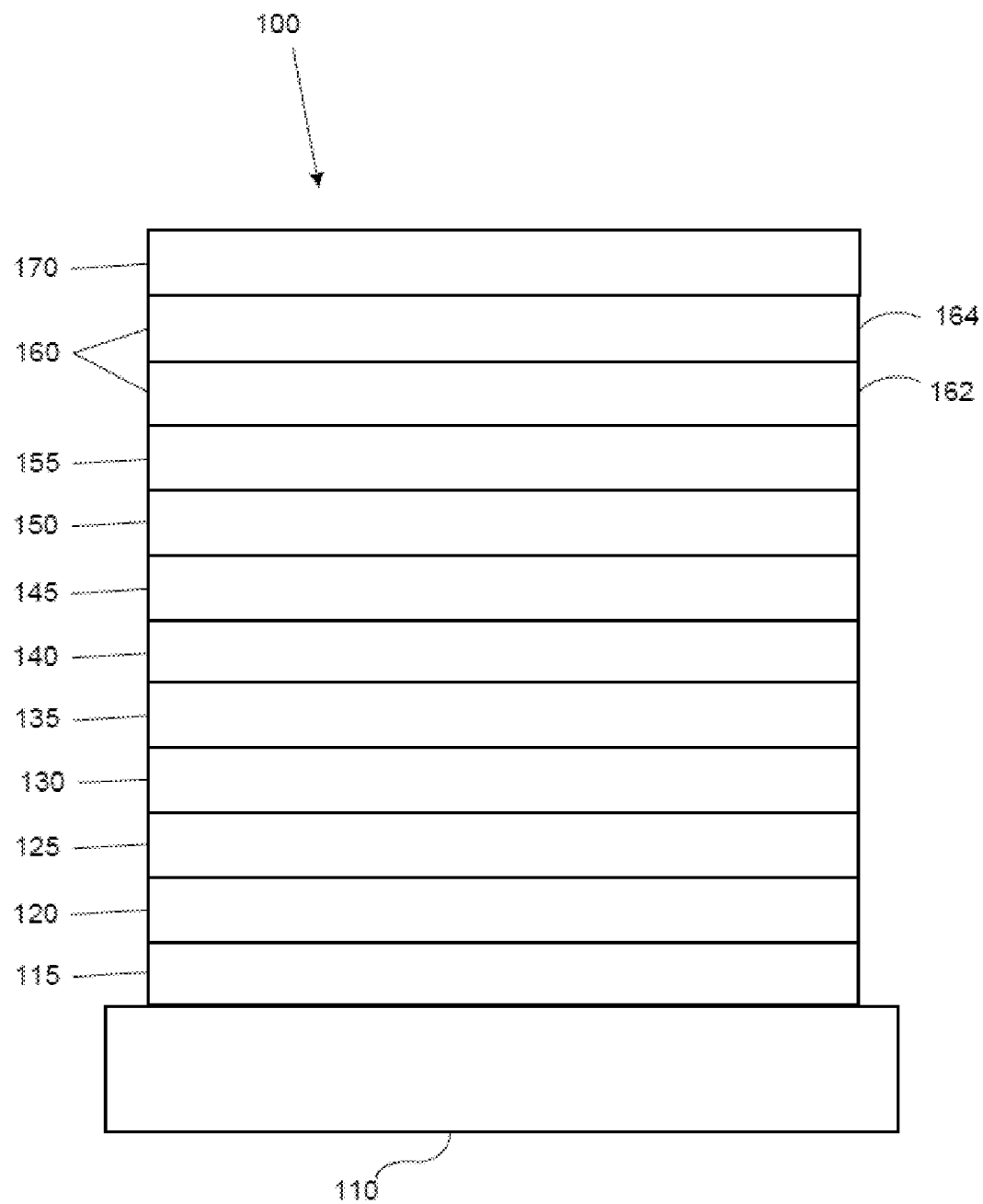
FIG. 1 shows an organic light emitting device (OLED).

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
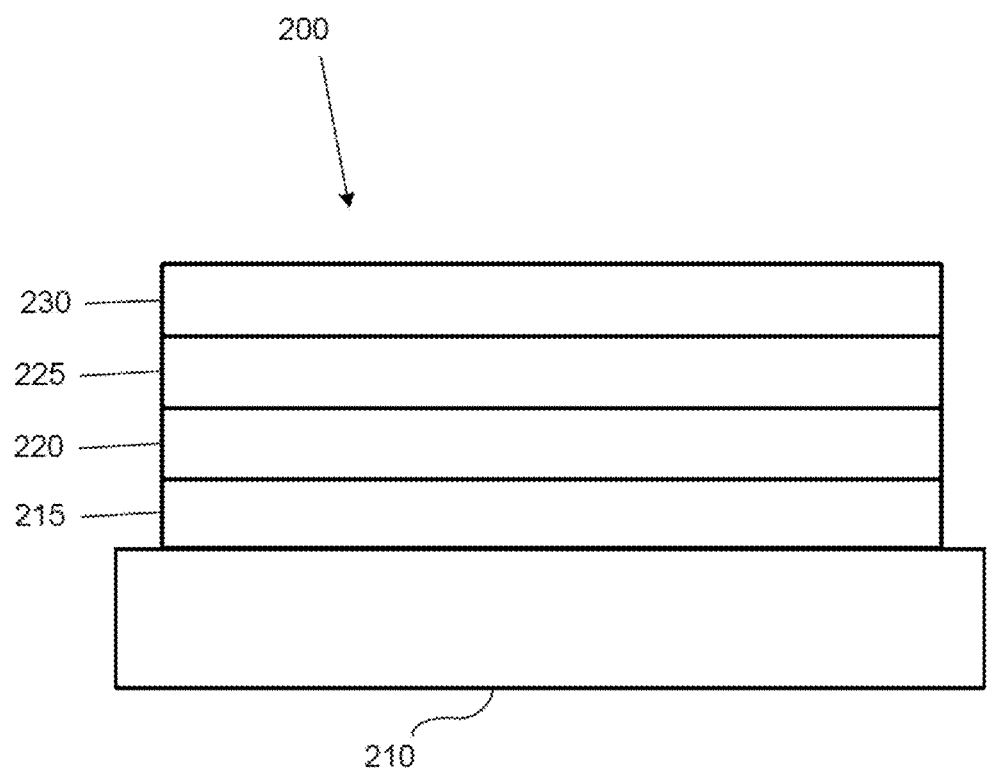
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to +80 C.

A surface topographic structure incorporated in an OLED can improve a light outcoupling efficiency of the OLED. Further improvement of light outcoupling can be realized through an additional index mismatching system as disclosed herein. The disclosed index mismatching system may include different index interface layers that enhance the scattering effect brought about by the surface topographic structure.

In a bottom emitting OLED including a high index substrate, higher light outcoupling efficiency may be realized by extracting light from the transparent electrode/organic waveguide. However, as a practical matter the index of the substrate typically is limited by material requirements and broader considerations, such as stress, environmental stability and fabrication conditions. Therefore, the index of the substrate is usually not as relatively high as the index of the transparent electrode/organic layers. In addition, intermediate multilayers with various functions may need to be placed between the substrate and OLED. Intermediate layers may include layers of silicon oxide, aluminum oxide, polymers etc., and may also have an index that is not relatively high. In this circumstance, relatively low index intermediate layers may limit light outcoupling efficiency due to the large amount of light that could be trapped at each interface of the different index layers.

Figure 3:
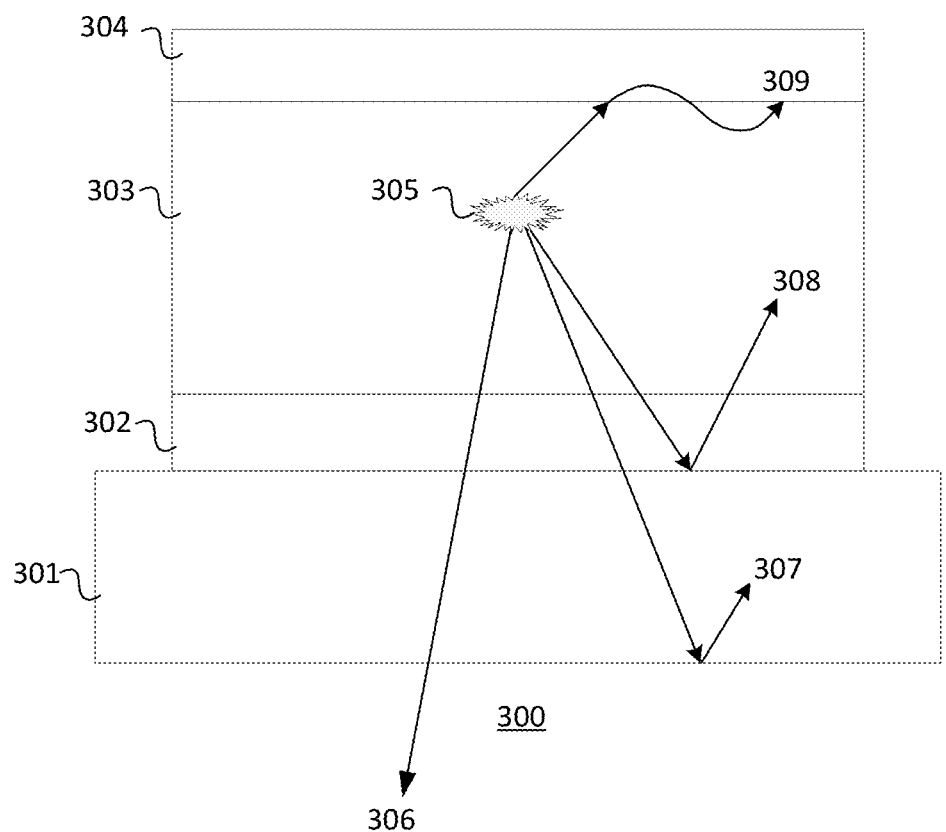
FIG. 3 shows a bottom-emitting OLED.

FIG. 3 shows an example bottom emitting OLED 300. OLED 300 may include a substrate 301, intermediate functional layer(s) 302 (which may include layers such as a planarizing layer, barrier layer, stress matching layer, transporting layer, etc.) an active area 303 including transparent electrode and organic layers, and a reflecting electrode 304. Light generated from an emitter 305 in the active area 303 may go through any of various different paths, alternately referred to as "modes" which the emitted light may assume. For example, light in outcoupled mode 306 refers to light emitted out of the device without needing any additional extracting structure or method. Light in substrate mode 307 refers to light that remains in the substrate 301 due to internal reflection that occurs at an interface of substrate 301 and air. Light in waveguide mode 308 refers to light that remains in the active area 303 due to index differences of the substrate 301 compared with the intermediate layers 302. Light in surface plasmon mode due 309 refers to light confined by surface plasmon resonance at the interface of an organic layer of the active area 303 and metal electrode 304.

Simulations have been conducted based on varying one or more layers with different indexes between substrate 301 and active area 303. The thickness and index used for the relatively lower index test cases include a 10 micrometer substrate (n=1.66), 2 micrometer low index layer (1.5), 120 nm transparent electrode (n=1.9+0.05i), 55 nm transporting layer #1 (n=1.8), a 27 nm emissive layer (EML) (n=1.8), transporting layer #2 (n=1.8) and 100 nm reflective electrode (n=1+6i). In the high index case for comparison, the 2 micrometer low index layer is replaced with a 2 micrometer high index layer (1.7) while all other factors remain equal.

Figure 4:
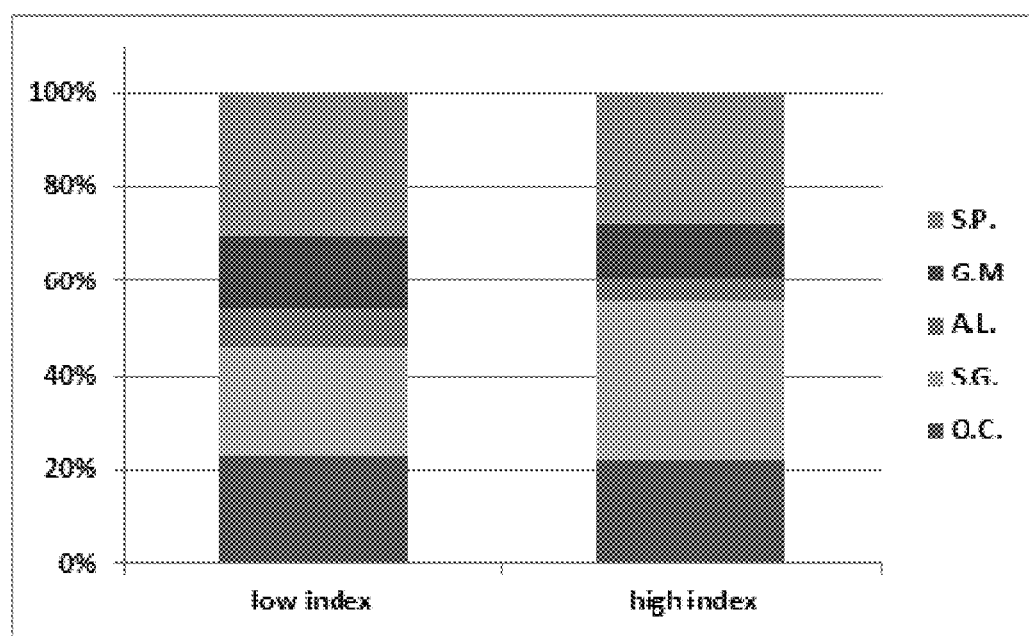
FIG. 4 shows histograms comparing light distributions in low index and high index intermediate functional layers.

FIG. 4 shows two histograms comparing respective light distributions in low index and high index intermediate functional layers. Different areas in the histogram indicate where the generated light is distributed. Between the two index cases there is no significant difference in the outcoupling mode, that is, about 25% of generated light is emitted in outcoupling mode (O.C.). Regarding the substrate, 23% of the light is trapped in substrate mode (S.G.) in the low index case, while about 34% of light is trapped in substrate mode in the high index case. However, light in the substrate mode can be extracted via modification of substrate surface. In the low index case, about 40% more light is trapped in the waveguide mode (G.M.) than that in high index case mode, due at least in part to the higher index difference between the functional layer and transparent electrode/organic materials. About 30% of the light is eventually evanescent through the surface plasmon loss at the interface of organic layers in the active area and metal electrode, i.e., distributed in surface plasmon mode (S.P.). In either case, a small amount of light is absorbed by materials and counted as being trapped in absorption mode (A.L.). Comparing the OLED having a high index functional layer(s) with the OLED having the low index functional layer(s), less light is trapped in the substrate mode (S.G.) and more light is trapped in the waveguide mode (G.M.) in low index test case. Thus, there is little to no benefit from including a relatively higher index of substrate if a low index intermediate functional layer exists.

Incorporating topographic structures to create surface scattering centers can be used to extract light trapped in substrate mode. The effect of the surface scattering centers may depend on several factors, including the type of structural feature incorporated in the topographic structure and a difference in index between the scattering centers and an adjacent medium. The x-y plane of the topographic feature determines the scattering wavelength while the depth of the feature in a z-direction affects the power of scattering. The z-direction dimension can be characterized by the root mean square (RMS) roughness as:

$$R_q = \sqrt{\frac{1}{n}\sum_{i=1}^{n} y_i^2} \qquad \text{Eq. 1}$$

In Eq. 1, $y_i$ is the profile height of each topographic feature, and n is the total number of features on the surface. The more the roughness of the surface increases, the stronger the scattering effect is. However, when applying topographic structures to OLEDs, especially as an internal outcoupling method in which the topographic structures are in between the substrate and reflecting electrode, the structure's influence on electrical property of other elements of the OLED should be considered. As roughness increases, electrical shorting becomes more likely to occur. This problem creates a practical upper limit for surface roughness, and therefore hinders exploitation of the surface scattering effect as a technique for improving outcoupling.

Another factor that affects the strength of the scattering effect is the index of the medium, more specifically, index mismatches at medium interfaces above, below and within the OLED. An index mismatch between the scattering centers and adjacent medium improves the potential for surface scattering so that light can interact with the topographic structure. The larger the mismatching of indexes, the stronger the scattering effect becomes. Therefore, increasing index mismatching can make increase surface scattering and thereby improve the light outcoupling efficiency of OLED.

In this disclosure, embodiments of index mismatching systems are incorporated at different interfaces where surface scattering takes place in order to increase the index difference therein. This technique of including index mismatching systems, for example, by including what will be referred to herein as "enhancement layers", may be combined with techniques of including topographic structures. An enhancement layer of the disclosed mismatching system may be designed to include topographic features to enhance scattering, otherwise a reduction in light outcoupling efficiency may occur when applying the disclosed mismatching system on planar structure. In some embodiments, a thickness of the enhancement layer is smaller than the effective thickness of the scattering depth of a feature of the topographic structure. Topographic structure feature depth may be evaluated, for example, as the peak to valley roughness, or the RMS roughness. The disclosed mismatching system may be designed to avoid negatively affecting the function of an existing topographic structure. Furthermore, to enhance compatibility with existing topographic structures and to improve outcoupling efficiency, the disclosed mismatching system may be designed to have an enhancement layer having a thickness of not more than 100 nm and include at least a 0.1 difference from an index of refraction of at a top layer and a bottom layer adjacent to the enhancement layer.

The disclosed mismatching system may increase a refractive index difference at interfaces in, above or below the OLED. Herein, "refractive index difference" may refer to a difference in indexes at a topographic interface. For example, a topographic structure layer with an index of $n_3$ is deposited on a first layer having an index of $n_1$. A second layer having an index of $n_2$ is deposited on the topographic side of the topographic structure layer. In this configuration, the refractive index difference would refer to the index difference between $n_2$ and $n_3$.

In some configurations, the topographic structure layer may have the same index as the first layer (i.e., $n_3=n_1$). If the disclosed mismatching system is applied as a single layer system, the refractive index of this single enhancement layer may be either larger or smaller than both indexes $n_3$, $n_1$ at the interface. Alternatively, a multilayer mismatching system may provide the same function. For example, a simple bilayer mismatching system may include a first layer with much higher index than both layers adjacent to the low index side and a second layer with much lower index than both next to the high index side. This configuration may not only increase the index mismatching in the system, but also increase the number of scattering centers due to the inclusion of additional interfaces.

Generally, materials for the disclosed mismatching system may be selected to enable an index difference of at least 0.1 compared to at least one adjacent layer. For example, materials may be selected to implement the mismatching system having a refractive index in the range of 1.0 to 3.0 as appropriate to implement the system at any given interface. Materials that can be used for the system include polymeric materials, inorganic materials and organic materials or the combination of them such as polyacrylate, polydimethylsiloxane (PDMS), lithium fluoride, magnesium fluoride, silicon nitrates, silicon dioxide, tantalum pentoxide, zinc sulfide and titanium dioxide, lithium quinolate, 4-bis(1-naphthyl-phenylamino)biphenyl, etc.

Figure 5:
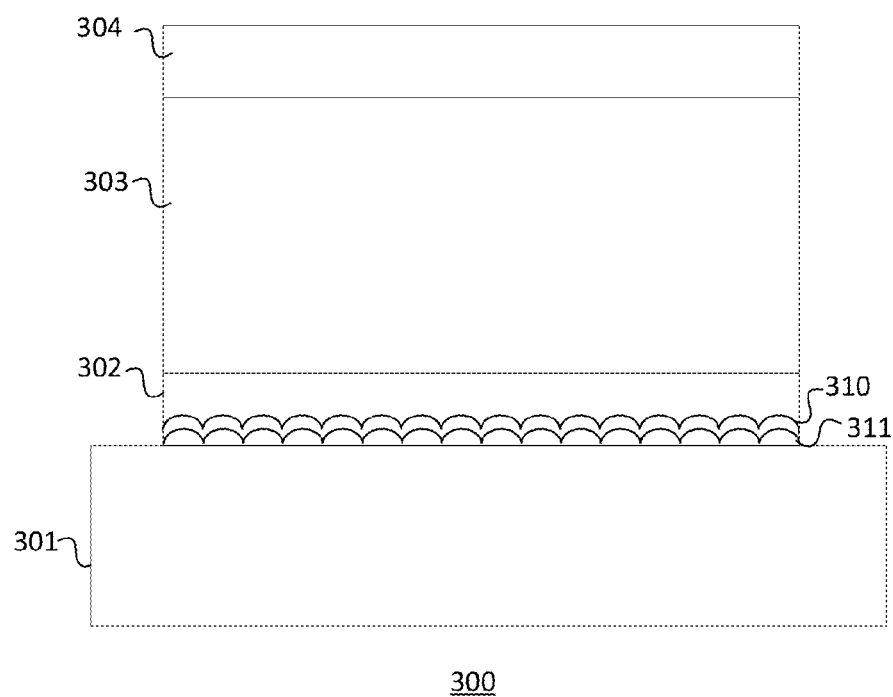
FIG. 5 an embodiment of a bottom emitting OLED including an index mismatching system according to the present disclosure.

FIG. 5 shows an embodiment of the bottom emitting OLED 300 from FIG. 3 including a topographic structure 311 and an index mismatching system comprising an enhancement layer 310 created at the interface of substrate 301 and intermediate functional layer 302. The enhancement layer 310 may be in direct physical contact with the topographic structure 311. The topographic structure 311 may be disposed adjacent to the substrate 301. The enhancement layer 310 may include topographic features matching or similar to features of the topographic structure 311, and may be disposed such that the features of the enhancement layer 310 are aligned with the features of the topographic structure 311. The scattering centers of the topographic structure 311 introduced at the interface can free light that may be trapped in the substrate 301 and the intermediate functional layers 302, thereby enhancing the outcoupling efficiency. Assuming wavelength independence scattering, the scattering effect may depend on the RMS roughness of the topographic structure. The enhancement layer 310 may further improve the scattering effect.

Figure 6:
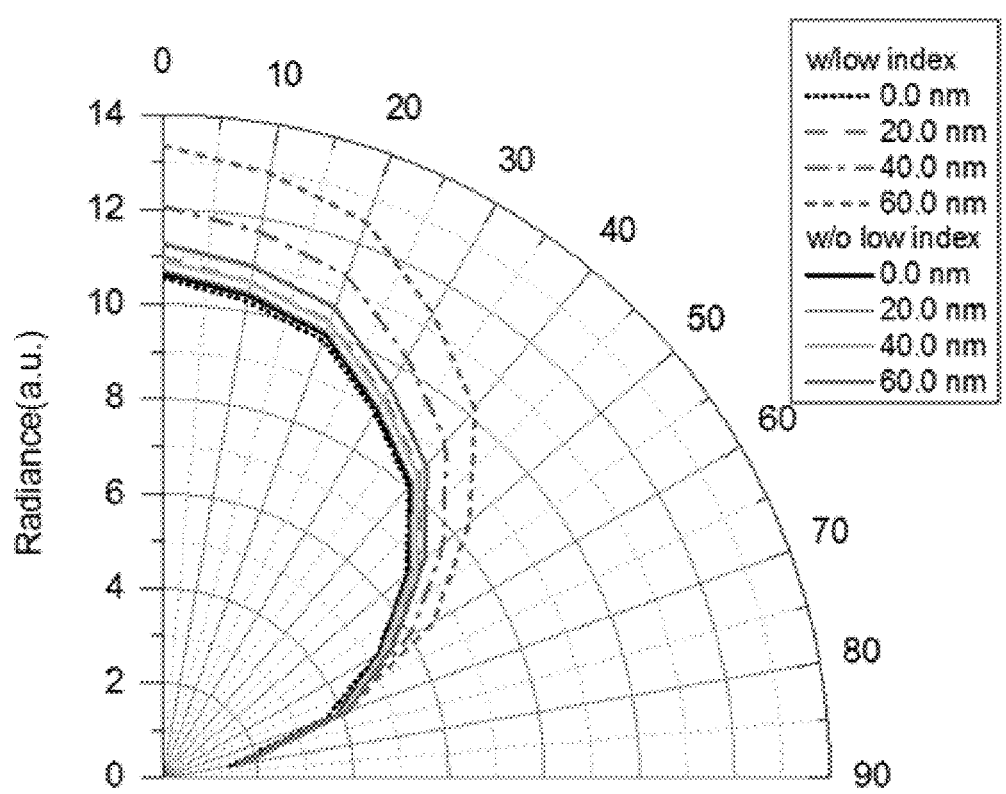
FIG. 6 shows a comparison of outcoupled light in an OLED with and without the inclusion of a low index mismatching system.

FIG. 6 shows a comparison of outcoupled light in an OLED with and without the inclusion of a low index mismatching system. Without a mismatching system, as the roughness of the topographic structure increases from 0 to 60 nm, the overall outcoupled light intensity increases 6.1%. Even with a roughness smaller than 40 nm, there is barely significant improvement. However, inserting a 10 nm thick low index (n=1.33) enhancement layer results in a stronger scattering effect. The 10 nm thickness does not negatively affect the features of the topographic structure. An overall enhancement of 25.5% can be realized with a 60 nm roughness topographic structure. Even with a 40 nm roughness surface, there is 14.4% enhancement in the outcoupling efficiency.

Figure 7:
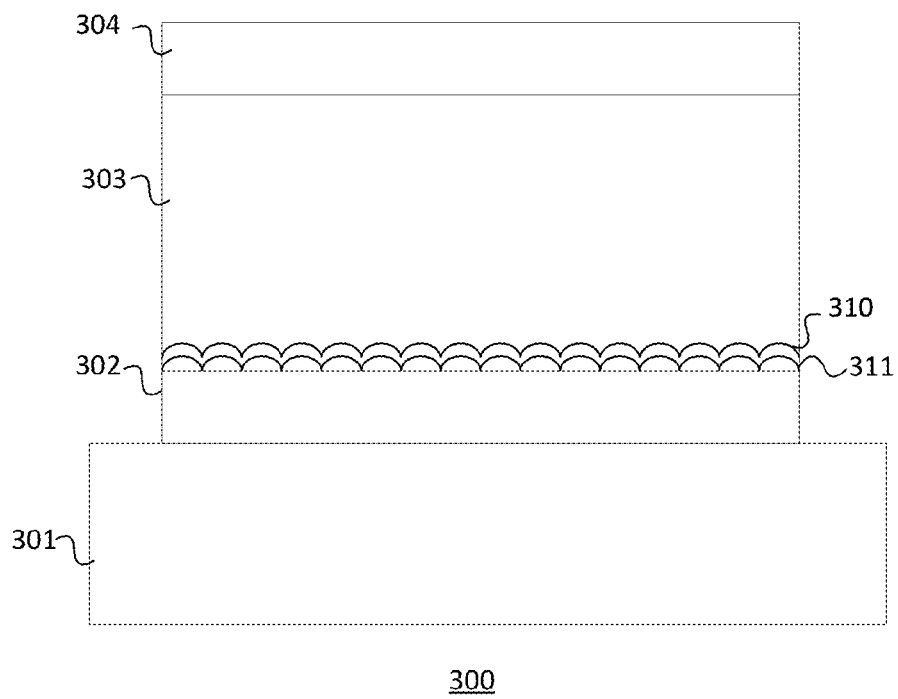
FIG. 7 shows another embodiment of a bottom emitting OLED including an index mismatching system according to the present disclosure.

FIG. 7. shows an embodiment of the bottom emitting OLED 300 from FIG. 3 in which the topographic structure 311 and enhancement layer 310 are created at the interface between the last functional intermediate layers 302 and a transparent electrode layer (not shown) of the active area 303. The topographic structure may be disposed adjacent to the functional intermediate layers 302. Scattering centers introduced at this interface target light trapped in the transparent electrode/organic and intermediate layers.

Figure 8:
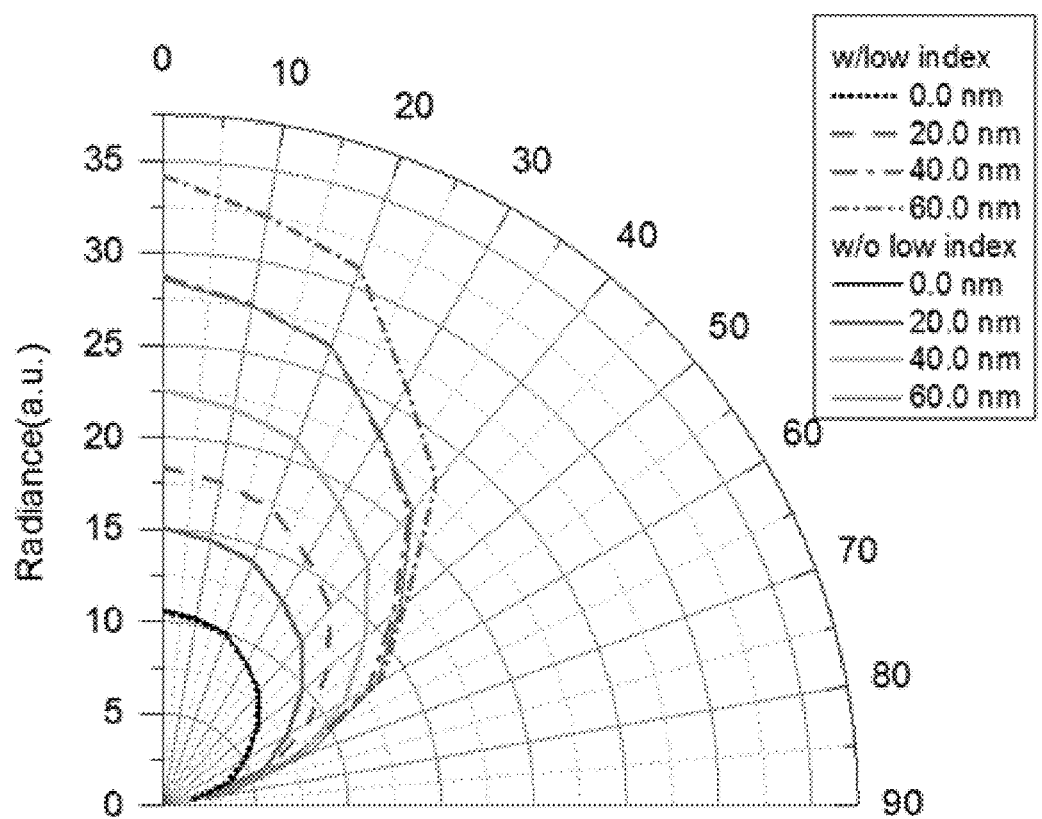
FIG. 8 shows a light outcoupling intensity comparison with and without the inclusion of a low index mismatching system enhancement layer.

Again, assuming wavelength independence scattering, the scattering effect will significantly depend on the RMS roughness of the topographic structure 311. In order to better analyze how much light the scattering centers can extract, an assumption of 100% extraction of substrate mode is made. With these assumptions, FIG. 8 shows a light outcoupling intensity comparison with and without the inclusion of a low index mismatching system enhancement layer. Without an enhancement layer, the overall intensity increased 158% as the roughness increased from 0 to 60 nm. However, inserting a 10 nm thick low index (n=1.33) enhancement layer yields a stronger scattering effect. As shown, a 193% overall enhancement can be realized with 60 nm roughness topographic structure. For each roughness sampling, inclusion of an enhancement layer has a positive impact on the scattering effect. Even with a roughness of 20 nm, an additional 10% of light can be extracted from the transparent electrode/organic waveguide with the inclusion of an enhancement layer.

In some embodiments, topographic structures may be included at multiple interfaces. For example, a first set of scattering centers may be introduced in first a topographic structure layer at a first interface of the substrate and functional layers, and a second set of scattering centers may be introduced in a second topographic structure layer at a second interface of the functional layers and a transparent electrode. Both waveguide mode and substrate mode can be extracted with this configuration, however, the refractive index difference may differ at those two interfaces. To optimize the overall scattering effect, different index mismatching enhancement layers may be applied. For example, if the indexes at the substrate interface are low (1.5~1.7) and the difference between them is small (0.2), a high index (>1.9) mismatching layer may be implemented at the substrate interface to improve outcoupling. If the index of one layer at the interface of transparent electrode is high (1.9) and the difference between those two layers is large (0.4), a low index (<1.3) mismatching layer can be used there to further enhance the scattering effect. Generally, the first and second topographic structure layers and the first and second enhancement layers may be constructed of materials and positioned to provide a maximum index difference at the first interface and at the second interface. This collaborative technique may be further carried out to enhance outcoupling at any number of interfaces.

Figure 9:
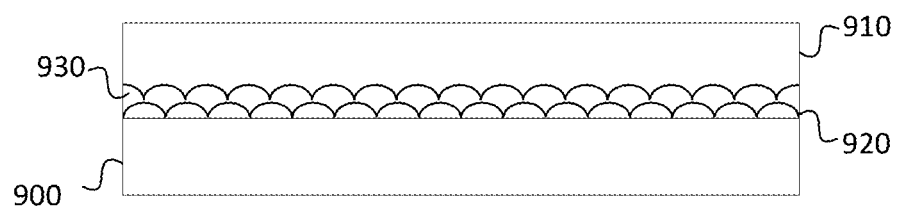
FIG. 9 shows an embodiment of an index mismatching system according to the present disclosure.
Figure 10:
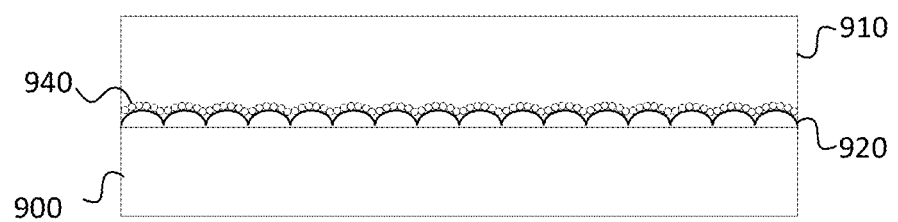
FIG. 10 shows another embodiment of an index mismatching system according to the present disclosure.

FIGS. 9 and 10 show embodiments of different types of topographic features that may be included in the index mismatching system. The index mismatching topographic features should not affect the dimension of features in an existing topographic structure, but may function to increase the scattering effect in other prospects, such as a certain range of wavelength. For example, as shown in FIG. 9, an index mismatching system enhancement layer 930 is included over a topographic structure 920 at an interface between a first layer 900 and a second layer 910. In this embodiment, the mismatching system enhancement layer 930 includes a feature contour that is the same as a feature contour of the topographical structure 920, but is not aligned with the topographical structure 920 feature.

Scattering centers at a micrometer length will give a broad scattering wavelength covering the visible spectrum. Generally, the enhancement layer 930 features may be a different size, e.g., smaller, than the topographic structure features so as to not have a negative impact on the function of the topographical structure 920 features. To further mitigate against negative impact on existing topographical features, the enhancement layer 930 should have a thickness of not more than 100 nm.

As shown in FIG. 10, an index mismatching system may also be implemented using features that are entirely different from an adjacent topographic structure. In FIG. 10, a polydimethylsiloxane (PDMS) mismatching layer 940 is used. If the PDMS layer 940 is properly treated, a sub micro buckling grating structure can form on the existing scattering centers. This will help extract the surface plasmon mode if the grating period matches the surface plasmon resonant wavelength in the OLED, and may cause a stronger scattering effect.

While FIGS. 9 and 10 provide different examples of the disclosed index mismatching system, it should be clear that both the topographic structure and index mismatching system could be implemented using any number of different types of features or combinations thereof, for example, including microlenses, a corrugated pattern, pyramidal features, spherical features, aspherical features, non-sharp-edged shapes and/or a wrinkled structure. Furthermore, different combinations may be applied at multiple interfaces above, below, or within the OLED simultaneously. In other words, a first and second plurality of topographical surface features may include features that have different shapes, sizes, or types.

Figure 11:
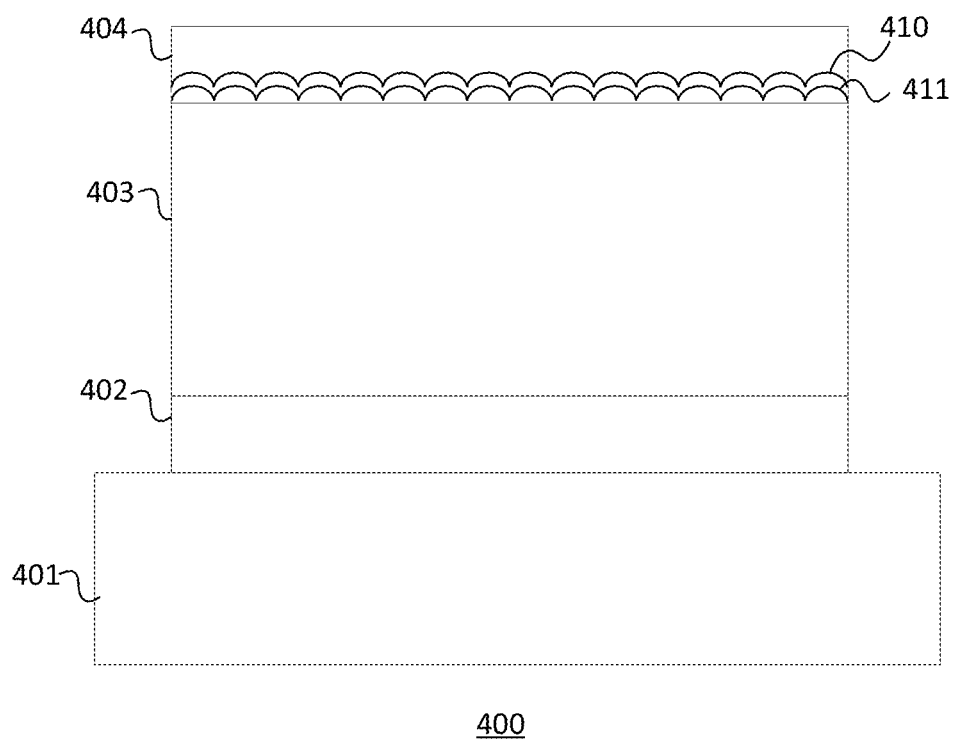
FIG. 11 shows an embodiment of an index mismatching system applied to a top-emitting OLED according to a present disclosure.

FIG. 11 shows an embodiment in which an index mismatching system is applied to a top-emitting OLED 400. A topographical structure 411 may be disposed adjacent to an OLED active area 403. An enhancement layer 410 may be disposed adjacent to the topographical structure and a transparent electrode 404. This implementation may require that the fabrication of the index mismatching system be compatible with the OLED fabrication process.

Generally, the disclosed mismatching system may be constructed in a fabrication process by disposing an OLED over a substrate, fabricating a first layer in a stack with the OLED, the first layer being optically coupled to the OLED and having a first surface including a first plurality of topographical surface features and an index of refraction $n_1$, and fabricating an enhancement layer in the stack with the OLED, the enhancement layer being optically coupled to the OLED and having a thickness of not more than 100 nm, a second surface including a second plurality of topographical surface features, and an index of refraction $n_2$. The index of refraction $n_2$ may have at least a 0.1 difference from an index of refraction of a top layer and a bottom layer adjacent to the enhancement layer.

Although various interfaces within a bottom-emitting and top-emitting OLED have been discussed herein, it should be clear that the disclosed index mismatching system may be applied to a topographical structure at any interface above, below, or within the OLED, regardless of the orientation of the OLED. Furthermore, the topographic structure need not be implemented in a separate layer, but may be implemented as features present on any existing layer, for example, on one of the intermediate function layers 302 shown in FIG. 3.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device, comprising:
a substrate;
an organic light emitting diode (OLED) disposed over the substrate;
a first layer optically coupled to the OLED and having a first surface including a first plurality of topographical surface features and an index of refraction n1; and
an enhancement layer optically coupled to the OLED and vertically stacked with the first layer, having a thickness of not more than 100 nm, a second surface including a second plurality of topographical surface features, and an index of refraction n2,
wherein n2 has at least a 0.1 difference from an index of refraction of a top layer and a bottom layer adjacent to the enhancement layer.

2. The device of claim 1, wherein the second plurality of topographical features are aligned with the first plurality of topographical surface features.

3. The device of claim 1, wherein the second plurality of topographical features have a contour that is the same as a contour of the first plurality of topographical features, but are not aligned with the first plurality of topographical surface features.

4. The device of claim 1, wherein the first plurality of topographical surface features is different from the second plurality of topographical surface features.

5. The device of claim 1, wherein each of the first and second plurality of topographical surface features is independently selected from a group consisting of: microlenses, a corrugated pattern, pyramidal features, spherical features, aspherical features, non-sharp-edged shapes and a wrinkled structure.

6. The device of claim 1, wherein the enhancement layer comprises a material having a refractive index in the range of 1.0 to 3.0.

7. The device of claim 1, wherein the enhancement layer comprises a material selected from the group consisting of: a polymeric material, an inorganic material, an organic material, or a metal.

8. The device of claim 1, wherein the second surface is not in direct physical contact with the first surface.

9. The device of claim 1, wherein the first layer is in direct physical contact with the enhancement layer.

10. The device of claim 9, wherein the first layer is disposed adjacent to the substrate.

11. The device of claim 9, wherein the first layer is disposed adjacent to the OLED.

12. The device of claim 1, further comprising a functional layer optically coupled to the OLED and disposed between the OLED and the substrate.

13. The device of claim 12, wherein the functional layer is one selected from the group consisting of: a barrier layer, a planarazing layer and a stress matching layer.

14. The device of claim 12, wherein the functional layer is the first layer.

15. The device of claim 12, wherein the first layer and the enhancement layer are disposed at an interface between the OLED and the functional layer.

16. The device of claim 12, wherein the first layer and the enhancement layer are disposed at an interface between the substrate and the functional layer.

17. The device of claim 12, further comprising:
- a second layer optically coupled to the OLED and having a third surface including a third plurality of topographical surface features and an index of refraction n3; and
- a second enhancement layer optically coupled to the OLED and vertically stacked with the second layer, having a thickness of not more than 100 nm, a fourth surface including a fourth plurality of topographical surface features, and an index of refraction n4,
- wherein n3 has at least a 0.1 difference from an index of refraction of a top layer and a bottom layer adjacent to the second enhancement layer.

18. The device of claim 17, wherein the first and second layers and the first and second enhancement layers are positioned to provide a maximum index difference at a first interface between the functional layer and the substrate and a second interface between the functional layer and the OLED.

19. The device of claim 17, wherein the first layer and the enhancement layer are disposed at a first interface between the substrate and the functional layer, and the second layer and the second enhancement layer are disposed at a second interface between the OLED and the functional layer.

20. A method of fabricating a device, the method comprising:
- disposing an OLED over a substrate;
- fabricating a first layer in a stack with the OLED, the first layer being optically coupled to the OLED and having a first surface including a first plurality of topographical surface features and an index of refraction n1; and
- fabricating an enhancement layer in the stack with the OLED, the enhancement layer being optically coupled to the OLED and having a thickness of not more than 100 nm, a second surface including a second plurality of topographical surface features, and an index of refraction n2,
- wherein n2 has at least a 0.1 difference from an index of refraction of a top layer and a bottom layer adjacent to the enhancement layer.

\* \* \* \* \*